SCHOTTKY BARRIER DIODE

Filed Feb. 26, 1969

INVENTORS J. C. IRVIN
B. SCHWARTZ
BY Edward M. Fink
ATTORNEY 3,585,075
Patented June 15, 1971

3,585,075
SCHOTTKY BARRIER DIODE

John C. Irvin, Berkeley Heights, and Bertram Schwartz, Westfield, N.J., assignors to Bell Telephone Laboratories, Incorporated, Murray Hill and Berkeley Heights, N.J.

Filed Feb. 26, 1969, Ser. No. 802,439
Int. Cl. B44d *1/18*
U.S. Cl. 117—217 4 Claims

ABSTRACT OF THE DISCLOSURE

A low work function Schottky barrier diode is obtained by coating a contact region upon a gallium arsenide substrate with a tin halide flux and subsequently depositing tin thereon.

Figure 1A:
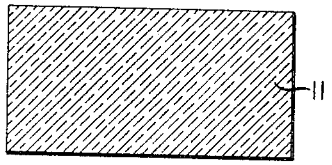

This invention relates to a method for the fabrication of metal-semiconductor diodes of the barrier type and to the diodes so produced. More particularly, the present invention relates to barrier type diodes comprising gallium arsenide and tin.

In recent years considerable interest has been generated in a class of semiconductor diodes of the barrier type, commonly referred to as Schottky diodes, which manifest non-ohmic behavior at metal-semiconductor junctions. Such devices are of particular interest in that (a) they the typically designed as majority carrier rectifiers, that is, non-injecting rectifying junctions, and (b) they manifest the properties of an ideal step junction. Accordingly, their suitability for specific applications is suggested.

Thus, the fact that only majority carriers contribute to the rectification process implies that the frequency response of the diode is limited only by RC charging or transit time, rather than by minority carrier lifetime. It logically follows that such devices are particularly suited for high speed switching applications, microwave detection and mixing, harmonic generation, parametric amplification (using the diode as a varactor), etc.

Similarly, the ideal step junction makes the Schottky barrier highly promising as a varactor, particularly in combination with epitaxy wherein the resultant configuration manifests a higher capacitive sensitivity with voltage than graded junctions with no accompanying loss in Q or breakdown voltage.

In light of the foregoing, workers in the art have continually sought to modify existing barrier devices to optimize the operating characteristics thereof and to develop new materials.

Among the more popular materials selected for use as the semiconductive portion of the diode has been gallium arsenide, such selection being based upon its electron mobility which is among the highest of the commercially available semiconductive materials, thereby permitting realization of minimum RC product while maintaining the capacitance of the unit at a sufficiently low level to facilitate broadband coupling to a microwave circuit. Additionally, exceptionally small donor ionization energies and relatively low effective density of states in the conduction band permit its operation at low temperatures without deterioration in performance due to carrier freeze out.

Metals employed heretofore as the metallic portion of the gallium arsenide barrier diode have included gold, aluminum, silver-titanium composites, and the platinum group metals. Unfortunately, difficulties have been encountered in attaining satisfactory wetting characteristics and intimate contact with the gallium arsenide, thereby limiting total exploitation of the device.

In accordance with the present invention, the prior art limitations alluded to hereinabove are effectively obviated in connection with tin, a low work function material, by the use of a novel processing sequence.

Briefly, the inventive technique involves coating the contact region of interest with a suitable halide flux prior to deposition of the tin, deposition being effected at temperatures ranging from 200° C. down to room temperature. The resultant structure has been found to manifest a barrier height of approximately 0.77 volt which compares favorably with those of the prior art and is lower than the commonly used Schottky barrier diode devices. Devices of the described type may suitably be employed as power rectifiers where the lower barrier height means less power loss in the rectifier, as detectors for RF or microwave applications where the low barrier height means increased sensitivity to very low level signals, and as a varactor where the low barrier height means, lower built-in voltage and hence greater capacity variation near the origin for small applied signals.

Figure 1B:
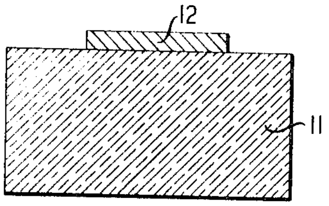
Figure 1C:
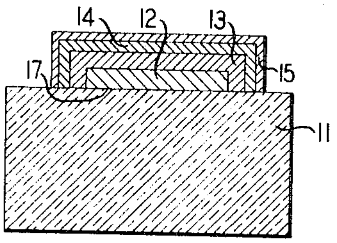
Figure 2:
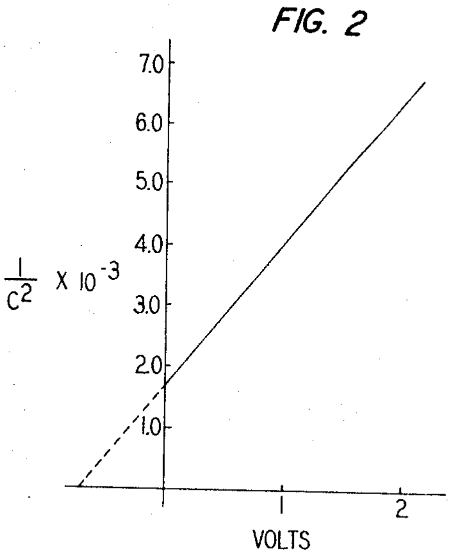

The invention will be more readily understood by reference to the following detailed description taken in conjunction with the accompanying drawing wherein:

FIGS. 1A through 1C are cross-sectional views of a gallium arsenide semiconductor wafer in successive stages of manufacture in accordance with the invention; and FIG. 2 is a graphical representation on coordinates of voltage against the reciprocal of the square of the capacitance for a Schottky barrier device prepared in accordance with the invention.

With further reference now to the drawing, there is shown in FIG. 1A a cross-sectional view of a typical n-type gallium arsenide crystal 11 suitable for the practice of the present invention. The n-type gallium arsenide employed herein may suitably be grown by the horizontal Bridgman technique and desirably evidences carrier concentrations within the range of $10^{15}$ to $10^{19}$ carriers per cubic centimeter. All crystals were 111 or 100 oriented, lapped and chemically polished in methyl alcohol bromine etchant and/or $H_2O—H_2SO_4$. The tin employed herein was 99.999 percent pure and the halides were reagent grade.

The first step in the inventive process involves coating the contact area of the etched n-type gallium arsenide with a flux selected from among $SnCl_2$ and $SnBr_2$, coating being effected either directly or by dissolving the flux in a suitable solvent and subsequently dipping the gallium arsenide wafer into the solution. However, for convenience, it has been found preferable to deposit the flux upon the substrate by evaporation through a suitable mask.

Following deposition of the flux upon the gallium arsenide substrate member, the tin is deposited upon the contact region. Deposition may be effected either by evaporation or by placing the metal in any suitable form upon the substrate and pulse heating the metal to 232° C. to effect melting thereof and wetting of the contact region solely without alloying, such being avoided by immediate cooling and solidification of the melted tin. Thereafter, the resultant assembly is maintained at a temperature ranging from room temperature to 200° C. The maximum temperature is dictated by considerations of metal-semiconductor fusion, that is, the point at which alloying occurs. The resultant structure shown in FIG. 1B includes a barrier region of tin 12. Contact is then made to the barrier region 12 by conventional techniques, for example, by standard beam lead contact procedures. Thus, a typical contact may comprise titanium 13, platinum 14, and gold 15 (FIG. 1C) as an overlay. In the completed device, shown in FIG. 1C, the barrier of interest is indicated at 17.

An example of the present invention is described in detail below for the purpose of aiding in the understanding of the invention.

EXAMPLE

This example describes the fabrication of a Schottky barrier diode comprising tin on 0.01 ohm centimeter n-type gallium arsenide substrate having a layer of tin on the back side thereof. A thin film of $SnCl_2$ was evaporated from a jig onto the 100 surface of the gallium arsenide substrate through a 5 mil aperture molybdenum mask. Thereafter, a thin film of tin was evaporated upon the $SnCl_2$ film from a second jig. Subsequent to the deposition of the tin film, the molybdenum mask was parted from the substrate member and the slice scribed in half. Thereafter, the capacitance of the resultant structure was measured as a function of voltage from 0 to 2 volts. For applied voltages of 0, 0.5, 1 and 2 volts, the capacitance was found to be 24.0, 18.8, 15.7, and 12.5 pf., respectively. This data was plotted on coordinates of voltage against the reciprocal of the capacitance squared (FIG. 2) in order to determine whether there had, in fact, been a Schottky barrier in the structure. As evidenced by reference to FIG. 2, it will be seen that the curve is linear, so indicating the presence of a Schottky barrier.

What is claimed is:

1. A method for forming a rectifying contact upon n-type gallium arsenide which comprises the steps of (a) coating the desired contact region with a halide selected from the group consisting of $SnCl_2$ and $SnBr_2$, and (b) subsequently depositing tin thereon.

2. A method in accordance with claim 1 wherein said halide is $SnCl_2$.

3. A method in accordance with claim 1 wherein said halide si $SnBr_2$.

4. A method in accordance with claim 1 wherein said tin is deposited by evaporation.

References Cited

UNITED STATES PATENTS

| | | | |
|---|---|---|---|
| 2,995,475 | 8/1961 | Sharpless | 117—217 |
| 3,076,324 | 2/1963 | Morgan | 117—71 |

ALFRED L. LEAVITT, Primary Examiner

C. K. WEIFFENBACH, Assistant Examiner

U.S. Cl. X.R.

117—107, 227, 106; 317—234, 235